United States Patent
Zhang et al.

(10) Patent No.: US 7,267,996 B2
(45) Date of Patent: Sep. 11, 2007

(54) IRIDIUM ETCHING FOR FERAM APPLICATIONS

(75) Inventors: Fengyan Zhang, Vancouver, WA (US); David R. Evans, Beaverton, OR (US); Wei Pan, Vancouver, WA (US); Lisa H. Stecker, Vancouver, WA (US); Jer-Shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 209 days.

(21) Appl. No.: 10/923,165

(22) Filed: Aug. 20, 2004

(65) Prior Publication Data

US 2006/0040493 A1 Feb. 23, 2006

(51) Int. Cl.
*H01L 21/467* (2006.01)

(52) U.S. Cl. .................. 438/3; 438/240; 438/656; 438/686; 438/720

(58) Field of Classification Search ................ 438/650
See application file for complete search history.

(56) References Cited

U.S. PATENT DOCUMENTS

| 6,323,132 B1 * | 11/2001 | Hwang et al. | ............. 438/706 |
| 6,492,222 B1 * | 12/2002 | Xing | ............. 438/240 |
| 6,602,720 B2 * | 8/2003 | Hsu et al. | ............. 438/3 |
| 2003/0059720 A1 * | 3/2003 | Hwang et al. | ............. 430/311 |

* cited by examiner

*Primary Examiner*—Stephen W. Smoot
(74) *Attorney, Agent, or Firm*—David C. Ripma

(57) ABSTRACT

A method of etching an iridium layer for use in a ferroelectric device includes preparing a substrate; depositing a barrier layer on the substrate; depositing an iridium layer on the barrier layer; depositing a hard mask layer on the iridium layer; depositing, patterning and developing a photoresist layer on the hard mask; etching the hard mask layer; etching the iridium layer using argon, oxygen and chlorine chemistry in a high-density plasma reactor; and completing the ferroelectric device.

10 Claims, 2 Drawing Sheets

1

IRIDIUM ETCHING FOR FERAM APPLICATIONS

FIELD OF THE INVENTION

This invention relates to iridium etching processes, and specifically to an iridium etching process, suitable for use in FeRAM applications, such as MFMIS, MFMS, MFIS, MIFS, MFS, and MIFIMIS, and to DRAM, capacitor, pyroelectric infrared sensor, optical display, optical switches, piezoelectric transducers, and surface acoustic wave devices applications.

BACKGROUND OF THE INVENTION

Iridium metal is difficult to etch regardless of whether one desires to wet or dry etch. State-of-the-art iridium etching uses chemistries of fluorine, chlorine or a combination of fluorine and chlorine to etch iridium. A significant problem using any know etching process is the presence of sidewall residue, erosion of a photoresist layer, and low selectivity between the etching properties of the iridium layer and an acceptable hard mask, resulting in etching of both the iridium, the hard mask and possibly an layer underlying the iridium.

SUMMARY OF THE INVENTION

A method of etching an iridium layer for use in a ferroelectric device includes preparing a substrate; depositing a barrier layer on the substrate; depositing an iridium layer on the barrier layer; depositing a hard mask layer on the iridium layer; depositing, patterning and developing a photoresist layer on the hard mask; etching the hard mask layer; etching the iridium layer using argon, oxygen and chlorine chemistry in a high-density plasma reactor; and completing the ferroelectric device.

It is an object of the invention to provide and etching process for iridium which results in clean sidewalls following etching.

Another object of the invention is to provide an iridium etching process which is highly selective over the hard mask and underlying layer for FeRAM applications, particularly in the case of an FeRAM having a PGO thin film or a doped PGO thin film.

Another object of the invention is to provide an iridium etching process wherein the etching process minimizes etching damage to the properties of incorporated ferroelectric thin film.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
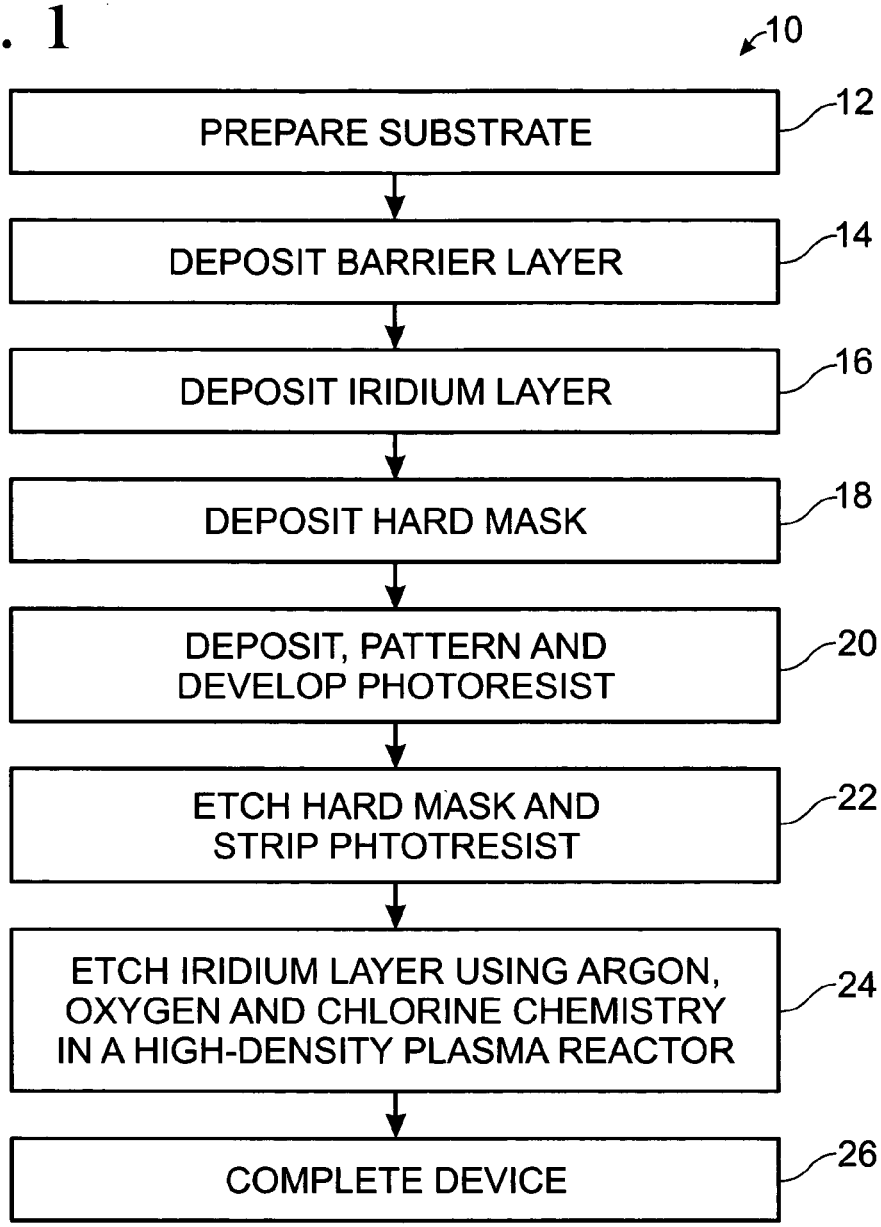
FIG. 1 is a block diagram of the method of the invention.
Figure 2:
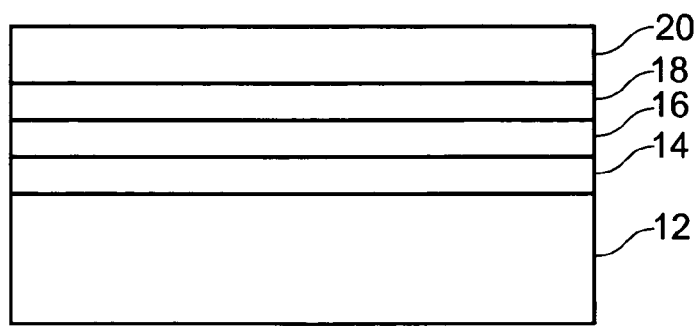
FIG. 2 depicts the layers of a semiconductor structure as seen at a mid-stage using the method of the invention.

The method of the invention is shown generally at 10 in FIG. 1, and now referring to FIGS. 1 and 2, begins with substrate preparation 12, which may include preparation of a conventional silicon, bulk silicon, silicon dioxide, or polysilicon substrate. Structures underlying the iridium layer are constructed, and a barrier layer 14 is deposited on the substrate or the underlying structures, to a thickness of between about 10 nm to 100 nm, using any of CVD, PVD, MOCVD, etc., deposition processes. The barrier layer may be any of the following: Ta, TaN, Ti, TiN, TiAlN, TaAlN, TiSiN, TaSiN, TiAl, or TiAlN. A thin layer of titanium may be used as an adhesive layer to enhance the adhesion between a barrier layer, such as TiN, and the iridium layer. An iridium layer is next deposited 16 on the barrier layer, to a thickness of between about 30 nm to 500 nm, using any of CVD, PVD, MOCVD, etc., deposition processes. A hard mask is deposited 18 on the iridium layer using TiN, $TiO_2$, Ta, TaN, TiAlN, TaAlN, TiSiN, TaSiN, TiAl, or TiAlN, to a thickness of between about 10 nm to 30 nm, using any of CVD, PVD, MOCVD, etc., deposition processes. The structure is coated with photoresist, which is patterned and developed, 20. After the hard mask is patterned and etched, 22, the photoresist is striped and the structure is ready for iridium etching.

The iridium etching process 24 of the method of the invention includes use of a gas chemistry mixture of Ar, $O_2$, and $Cl_2$. The $Cl_2$ gas component may be replaced by $BCl_3$, $CCl_4$, $SiCl_4$, or their combinations. The total gas flow rate is between about 20 sccm to 100 sccm, with a preferred range of between about 40 sccm to 70 sccm. The process pressure is maintained at between about 1 mtorr. to 50 mtorr, and preferably at between about 3 mtorr. to 10 mtorr. The microwave power is between about 400 W to 1000 W, and the substrate RF bias power is between about 10 W to 1000 W. The substrate temperature is between about −50° C. to 500° C. and it is preferred at room temperature to 300° C. The percentage of the oxygen in the gas chemistry is in the range of between about 1% to 80%, and is preferred in a range of between about 5% to 50%. The percentage of argon in the gas chemistry is in the range of between about 5% to 80%, and is preferred in a range of between about 20% to 50%. The remaining gas in the chemistry is $Cl_2$ chemistry.

The addition of oxygen to the chlorine and argon chemistry significantly increases the selectivity of iridium over the hard mask and the selectivity of iridium over the underlying barrier layer. This is very important when etching the metal-ferroelectric-metal stack on the gate region because, when the iridium bottom electrode is deposited on a thin gate oxide, the high selectivity of the iridium layer over the barrier layer allows the etching process to stop at the barrier layer, thereby avoiding over etching into the source-drain region. In the case where a polysilicon buffer layer is located between the bottom electrode and the gate oxide, the etching of the iridium layer stops on the barrier layer, which provides for subsequent uniform etching of the polysilicon layer.

Another important etching step which facilitates elimination of sidewall residue is an over etching process, performed at a lower RF bias power, e.g., between about 5 W to 150 W. Because of the high selectivities of the iridium over the hard mask and the iridium over the underlying barrier layer, this over etching effectively cleans the sidewall residue, sacrificing very little of the hard mask and the underlying barrier layer.

The high selectivity of iridium over the barrier layer ensures that the gate stack may be etched without damage to the source-drain region, such as in an MFMIS structure, where "M" refers to the Ir/barrier layer combination, or to Ir/barrier/polysilicon layer combination structure; "I" refers to an insulating layer, such as silicon dioxide layer or high-k gate dielectric layers, including pure or doped $ZrO_2$, $HfO_2$, $LaO_x$, etc; and "F" refers to a ferroelectric material, such as PGO (Lead Germanium Oxide ($Pb_5Ge_3O_{11}$)), or doped PGO, such as tin doped PGO (PSGO).

The etching process minimizes the etching damage to the ferroelectric film, including ferroelectric films such as PGO and doped PGO, such as PSGO. The etching step may include an over etching step, which cleans the sidewall residue using low RF bias power. A thick, e.g., 300 nm, TiN layer formed over the iridium stack may be applied in a replacement gate formation process, e.g., after etching the TiN/Ir/barrier/polysilicon stack, a layer of TEOS (tetraethylorthosilicate oxide (oxane)), about twice of the thickness of gate stack, is deposited over the etched gate stack. The stack is polished by CMP to remove the TEOS, stopping at the TiN surface. After removal of the TiN layer, the structure is ready for film deposition, such as deposition of a ferroelectric thin film, and completion of the semiconductor device, 26.

The same chemistry and method of the invention may also be applied to an Al/Ir etching process which may be used to form a replacement gate.

Figure 3:
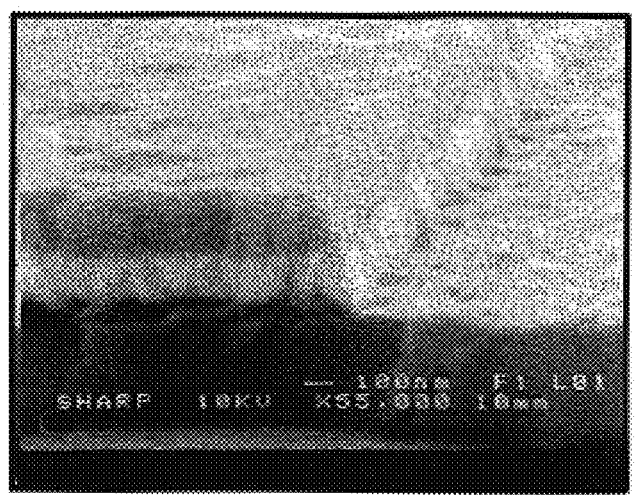
FIG. 3 is a microphotograph of an etching profile of Ir/TaN electrode/barrier using TiN hard mask, after etching.
Figure 4:
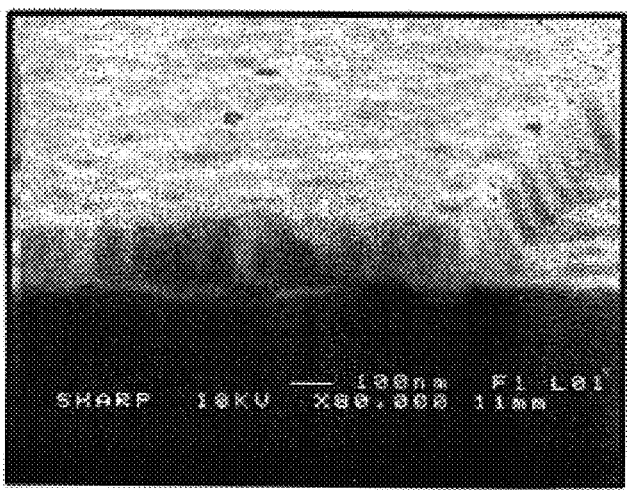
FIG. 4 is a microphotograph of an etching profile of Ir/TaN electrode/barrier after removal of the TiN hard mask.

FIGS. 3 and 4 depict sample of structures fabricated according to the method of the invention. The etching process may use any state-of-the-art, high-density plasma reactor. An example is an Electron Cyclotron Resonance (ECR) plasma reactor. In this case, the ion density and ion energy in the plasma are controlled independently by adjusting the ECR microwave power and the RF bias power. The gas chemistry used includes between about 30% to 50% argon, between about 10% to 30% oxygen, and between about 30% to 50% chlorine. The process pressure is between about 5 mtorr. to 10 mtorr. The microwave power is between about 500 W to 800 W, and the RF bias power is between about 100 W to 400 W. The over etching step is performed at an RF bias power in the range of between about 5 W to 150 W. FIG. 3 depicts the results following etching of a structure having a TiN layer of about 200 nm, an iridium layer of about 150 nm, and a TaN layer of about 50 nm. FIG. 4 depicts the etch profile of the iridium layer after the TiN layer is removed, as by stripping in a solution of $H_2O$: $NH_4OH$:$H_2O_2$, in a mix ratio of 5:3:2.

Thus, a method for etching iridium for FeRAM applications has been disclosed. It will be appreciated that further variations and modifications thereof may be made within the scope of the invention as defined in the appended claims.

We claim:

1. A method of etching an iridium layer for use in a ferroelectric device, comprising:
    preparing a substrate;
    depositing a barrier layer on and in contact with the substrate;
    depositing an iridium layer on the barrier layer;
    depositing a layer of TiN over the iridium layer as a replacement gate;
    etching a portion of the iridium/TiN stack;
    depositing a layer of TEOS over the remaining iridium/TiN stack;
    polishing to remove the TEOS layer to the level of the upper surface of the TIN layer;
    etching to remove the TiN layer;
    depositing a hard mask layer on and in contact with the iridium layer;
    depositing, patterning and developing a photoresist layer on the hard mask;
    etching the hard mask layer;
    etching the iridium layer using argon, oxygen and chlorine chemistry in a high-density plasma reactor; and
    depositing a layer of ferroelectric material in place of the removed TiN;
    completing the ferroelectric device.

2. The method of claim 1 wherein said etching the iridium layer includes a gas chemistry mixture of Ar, $O_2$, and a chlorine containing gas taken from the group of chlorine-containing gases consisting of $Cl_2$, $BCl_3$, $CCl_4$, $SiCl_4$, and their combinations, wherein the percentage of the oxygen in the gas chemistry is in the range of between about 5% to 50%, the percentage of argon in the gas chemistry is in the range of between about 20% to 50%, and wherein the remaining gas in the chemistry is the chlorine-containing gas; at a total gas flow rate of between about 40 sccm to 70 sccm, a process pressure of between about 3 mtorr. to 10 mtorr.

3. The method of claim 2 wherein the microwave power in the reactor is between about 400 W to 1000 W, the substrate RF bias power is between about 10 W to 1000 W, and the substrate temperature is between about −50° C. to 500° C.

4. The method of claim 1 wherein said preparing the substrate includes preparing a substrate taken from the group of substrates consisting of conventional silicon, bulk silicon, silicon dioxide, and polysilicon substrate.

5. The method of claim 1 wherein said depositing a barrier layer includes depositing a layer of material taken from the group of materials consisting of Ta, TaN, Ti, TiN, TiAlN, TaAlN, TiSiN, TaSiN, TiAl, and TiAlN, to a thickness of between about 10 nm to 100 nm.

6. The method of claim 1 wherein said depositing an iridium layer includes depositing a layer of iridium to a thickness of between about 30 rim to 500 rim.

7. The method of claim 1 wherein said depositing a hard mask includes depositing a layer of material taken from the group of materials consisting of TiN, $TiO_2$, Ta, TaN, TiAlN, TaAlN, TiSiN, TaSiN, TiAl, and TiAlN, to a thickness of between about 10 rim to 30 rim.

8. The method of claim 1 wherein said completing the ferroelectric device includes depositing a ferroelectric layer taken from the group of ferroelectric materials consisting of PGO and doped PGO.

9. The method of claim 1 which includes, after said depositing a barrier layer, depositing an adhesive layer before said depositing an iridium layer, wherein the adhesive layer includes depositing a layer of Ti.

10. A method of etching an iridium layer for use in a ferroelectric device, comprising:
    preparing a substrate;
    depositing a barrier layer on the substrate;
    depositing an iridium layer on the barrier layer;
    depositing a layer of TiN over the iridium layer, forming an iridiuim/TiN stack, as a replacement gate;
    depositing a hard mask layer on the iridium layer;
    depositing, patterning and developing a photoresist layer on the hard mask;
    etching the hard mask layer;
    etching a portion of the iridium/TiN stack;
    depositing a layer of TEOS over the remaining iridium/TiN stack;

polishing to remove the TEOS layer to the level of the upper surface of the TiN layer;
etching to remove the TiN layer;
depositing a layer of ferroelectric material in place of the removed TiN;

etching the iridium layer using argon, oxygen and chlorine chemistry in a high-density plasma reactor; and
completing the ferroelectric device.

* * * * *